United States Patent
Chung et al.

(10) Patent No.: US 7,268,029 B2
(45) Date of Patent: Sep. 11, 2007

(54) METHOD OF FABRICATING CMOS TRANSISTOR THAT PREVENTS GATE THINNING

(75) Inventors: Eun-kuk Chung, Seoul (KR); Joon Kim, Seoul (KR); Suk-Chul Bang, Gyeonggi-do (KR); Jong-Sun Ahn, Gyeonggi-do (KR); Sang-hoon Lee, Gyeonggi-do (KR); Woo-soon Jang, Seoul (KR); Yung-jun Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 109 days.

(21) Appl. No.: 10/994,042

(22) Filed: Nov. 19, 2004

(65) Prior Publication Data

US 2005/0112814 A1    May 26, 2005

(30) Foreign Application Priority Data

Nov. 21, 2003   (KR) ............. 10-2003-0083042

(51) Int. Cl.
*H01L 21/8238*    (2006.01)

(52) U.S. Cl. .............. 438/199; 438/592; 438/659; 438/660; 257/E21.632; 257/E21.177

(58) Field of Classification Search ............. 438/151, 438/154, 197, 199, 588, 592, 659, 660, 663; 257/E21.632, E21.177
See application file for complete search history.

(56) References Cited

U.S. PATENT DOCUMENTS

| | | | | |
|---|---|---|---|---|
| 5,480,830 A | * | 1/1996 | Liao et al. | 438/199 |
| 5,604,157 A | * | 2/1997 | Dai et al. | 438/297 |
| 5,882,962 A | * | 3/1999 | Tseng et al. | 438/197 |
| 6,150,205 A | * | 11/2000 | Chen et al. | 438/199 |
| 6,165,876 A | * | 12/2000 | Yamazaki et al. | 438/517 |
| 6,232,208 B1 | * | 5/2001 | Wu et al. | 438/585 |
| 6,245,682 B1 | | 6/2001 | Fu et al. | |
| 6,348,289 B1 | * | 2/2002 | Couteau et al. | 430/30 |
| 6,503,788 B1 | * | 1/2003 | Yamamoto | 438/231 |
| 6,524,902 B2 | * | 2/2003 | Rhee et al. | 438/199 |
| 6,645,799 B2 | * | 11/2003 | Yamamoto | 438/199 |
| 6,677,652 B2 | * | 1/2004 | Lin et al. | 257/407 |
| 2002/0042173 A1 | * | 4/2002 | Takamura | 438/199 |

* cited by examiner

*Primary Examiner*—Scott B. Geyer
*Assistant Examiner*—Stanetta Isaac
(74) *Attorney, Agent, or Firm*—Marger Johnson & McCollom, P.C.

(57) ABSTRACT

Provided is a method of fabricating a CMOS transistor in which, after a polysilicon layer used as a gate is formed on a semiconductor substrate, a photoresist pattern that exposes an n-MOS transistor region is formed on the polysilicon layer. An impurity is implanted in the polysilicon layer of the n-MOS transistor region using the photoresist pattern as a mask, and the photoresist pattern is removed. If the polysilicon layer of the n-MOS transistor region is damaged by the implanting of the impurity, the polysilicon layer of the n-MOS transistor region is annealed, and a p-MOS transistor gate and an n-MOS transistor gate are formed by patterning the polysilicon layer. The semiconductor substrate, the p-MOS transistor gate and the n-MOS transistor gate is cleaned with a hydrofluoric acid (HF) solution, without causing a decrease in height of the n-MOS transistor gate.

23 Claims, 5 Drawing Sheets

METHOD OF FABRICATING CMOS TRANSISTOR THAT PREVENTS GATE THINNING

CROSS REFERENCE TO RELATED APPLICATION

This application claims priority from Korean Patent Application No. 2003-83042, filed on Nov. 21, 2003, in the Korean Intellectual Property Office, the disclosure of which is hereby incorporated by reference in its entirety.

BACKGROUND OF THE INVENTION

1. Field of the Invention

The present invention relates to a method of manufacturing a semiconductor device, and more particularly, to a method of fabricating a CMOS transistor.

2. Description of the Related Art

Demands for CMOS transistors with high density and high operating speed have required the thickness of a polysilicon layer used as a gate insulating layer and a gate to decrease. As the polysilicon layer has become thinner, depletion has become more significant. As a result, the dose of an impurity needed to implant into a polysilicon layer to form an n-MOS gate has increased. This increase in dose has presented problems that will be shown by describing a prior art method of fabricating a CMOS transistor.

FIGS. 1 through 5 are cross-sectional views showing a prior art method of fabricating a CMOS transistor.

Referring to FIG. 1, a polysilicon layer 20, which is used as a gate insulating layer (not shown) and a gate, is formed on a semiconductor substrate 10, e.g. a silicon substrate. Next, a buffer oxide 30 is formed on the polysilicon layer 20. The semiconductor substrate 10 includes a p-MOS transistor (TR) region for forming a p-MOS transistor and an n-MOS TR region for forming an n-MOS transistor.

Referring to FIG. 2, a photoresist pattern 40 is formed on the buffer oxide 30. Next, a required dose of impurity, e.g. phosphorous (P), is implanted into the polysilicon layer 20 of the exposed n-MOS TR region using the photoresist pattern 40 as an ion-implantation mask.

If the dose of the impurity implanted into the polysilicon layer 20 of the n-MOS TR region is too large, a damaged region 50 is formed in an upper portion of the polysilicon layer 20 of the n-MOS TR region despite the presence of the buffer oxide 30.

Referring to FIG. 3, the photoresist pattern 40 is removed. Next, the buffer oxide 30 is removed using an oxide etching solution. After the buffer oxide 30 is removed, an antireflection film 60 is deposited on the polysilicon layer 20 using film materials such as silicon-oxy-nitride (SiON). The damaged region 50 remains in the polysilicon layer 20 of the n-MOS TR region.

Referring to FIGS. 4 and 5, after a photoresist pattern (not shown) is formed on the antireflection film 60, etching for gate formation is performed. Thus, a p-MOS transistor gate 20a and an n-MOS transistor gate 20b are formed.

Next, as shown in FIG. 5, the antireflection film 60 is removed by cleaning with a solution including hydrofluoric acid (HF) and hydrogen peroxide ($H_2O_2$). However, in this prior art method for fabricating a CMOS transistor, the damaged region 50 of FIG. 5 present in the upper portion of the n-MOS transistor gate 20b is removed during the cleaning. Thus, gate thinning occurs in which the n-MOS transistor gate 20b decreases in height. The height difference between the n-MOS transistor gate 20b and the p-MOS transistor gate 20a can cause a contact failure in a later process.

Embodiments of the invention address these and other limitations in the prior art.

SUMMARY OF THE INVENTION

Embodiments of the present invention provides a method of fabricating a CMOS transistor in which a height difference between an n-MOS transistor gate and a p-MOS transistor gate is prevented.

According to one embodiment of the present invention, there is provided a method of fabricating a CMOS transistor. The method includes forming a polysilicon layer to be used as a gate on a semiconductor substrate; forming a photoresist pattern that exposes an n-MOS transistor region on the polysilicon layer; implanting an impurity into the polysilicon layer of the n-MOS transistor region using the photoresist pattern as a mask; removing the photoresist pattern; annealing the polysilicon layer of the n-MOS transistor region that is damaged by the implanting; forming a p-MOS transistor gate and an n-MOS transistor gate by patterning the polysilicon layer; and cleaning the semiconductor substrate, the p-MOS transistor gate and the n-MOS transistor gate with a hydrofluoric acid (HF) solution, without causing a substantial reduction in height of the n-MOS transistor gate.

The annealing of the damaged polysilicon of the n-MOS transistor region is performed using a thermal process at a temperature of approximately 100-600° C. The ratio of pure water ($H_2O$) to hydrofluoric acid (HF) is approximately 5:1-2000:1 in the hydrofluoric acid (HF) solution.

According to another embodiment of the present invention, there is provided a method of fabricating a CMOS transistor. The method includes depositing a polysilicon layer to be used as a gate on a semiconductor substrate; forming a buffer oxide on the polysilicon layer; forming a photoresist pattern that exposes an n-MOS transistor region on the buffer oxide; implanting an impurity into the polysilicon layer of the n-MOS transistor region using the photoresist pattern as a mask; removing the photoresist pattern and the buffer oxide; annealing the polysilicon layer of the n-MOS transistor region that is damaged by the implanting of the impurity; forming an antireflection film on the polysilicon layer; forming a p-MOS transistor gate and an n-MOS transistor gate by patterning the polysilicon layer; and cleaning the semiconductor substrate, the p-MOS transistor gate and the n-MOS transistor gate with a hydrofluoric acid (HF) solution, without causing a reduction in height of the n-MOS transistor gate.

According to still another embodiment of the present invention, there is provided a method of fabricating a CMOS transistor. The method includes forming a polysilicon layer to be used as a gate on a semiconductor substrate; forming a photoresist pattern that exposes an n-MOS transistor region on the polysilicon layer; implanting an impurity into the polysilicon layer of the n-MOS transistor region using the photoresist pattern as a mask; removing the photoresist pattern; annealing the polysilicon layer of the n-MOS transistor region that is damaged by the implanting of the impurity; forming a p-MOS transistor gate and an n-MOS transistor gate by patterning the polysilicon layer; and cleaning the semiconductor substrate, the p-MOS transistor gate and the n-MOS transistor gate with a cleaning solution that has substantially no oxygen ($O_2$) or hydrogen peroxide ($H_2O_2$) not to cause a substantial decrease in height of the n-MOS transistor gate.

As described above, in the method of fabricating the CMOS transistor according to embodiments of the present invention, a substantial decrease in height of the n-MOS transistor gate does not occur.

BRIEF DESCRIPTION OF THE DRAWINGS

The above and other features and advantages of the present invention will become more apparent by describing in detail an exemplary embodiment thereof with reference to the attached drawings in which.

DETAILED DESCRIPTION OF THE PREFERRED EMBODIMENTS

Figure 1:
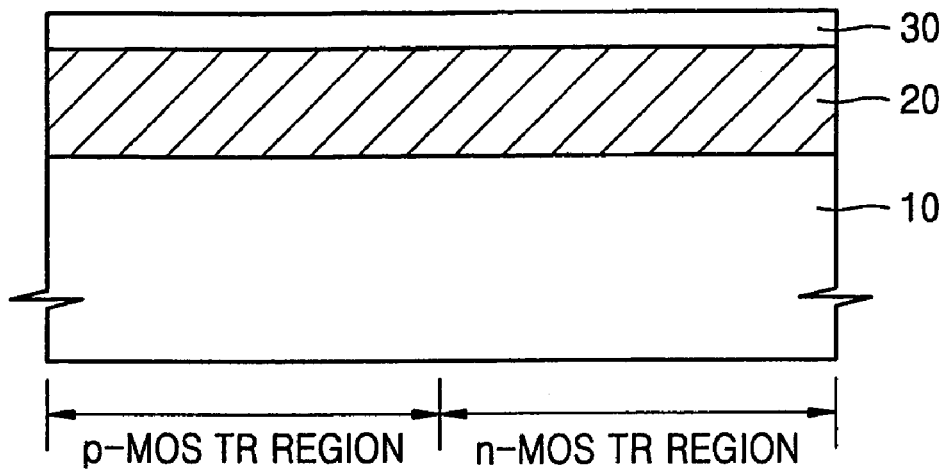
FIGS. 1 through 5 are cross-sectional views explaining a prior art method for fabricating a CMOS transistor.
Figure 2:
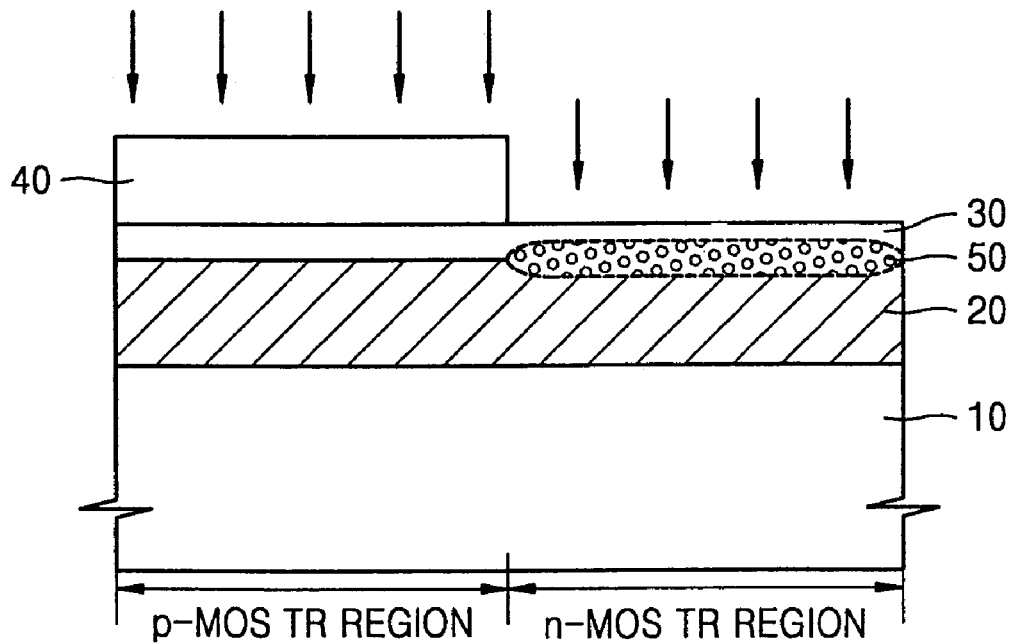
Figure 3:
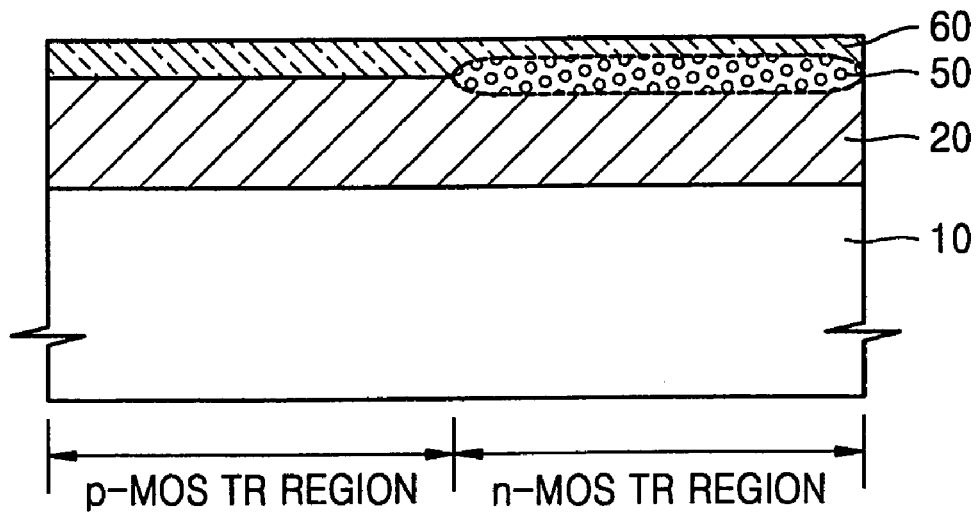
Figure 4:
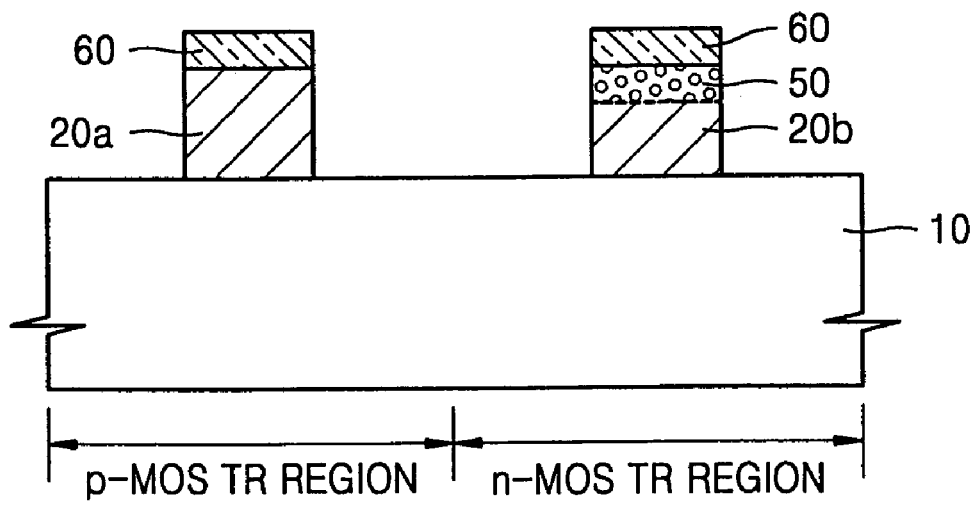
Figure 5:
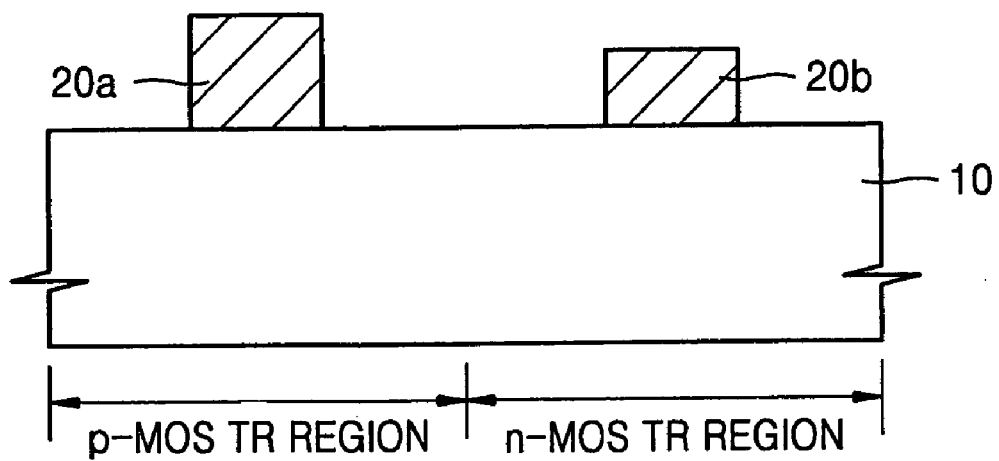

Embodiments of the present invention will now be described more fully with reference to the accompanying drawings, in which an exemplary embodiment of the invention is shown. Throughout the drawings, like reference numerals are used to refer to like elements. Additionally, it will be understood that when an element such as a layer, region or substrate is referred to as being "on" or "onto" another element, it can be directly on the other element or intervening elements may also be present. Additionally, the layer, region or substrate could be partially within or partially embedded in another element.

Figure 6:
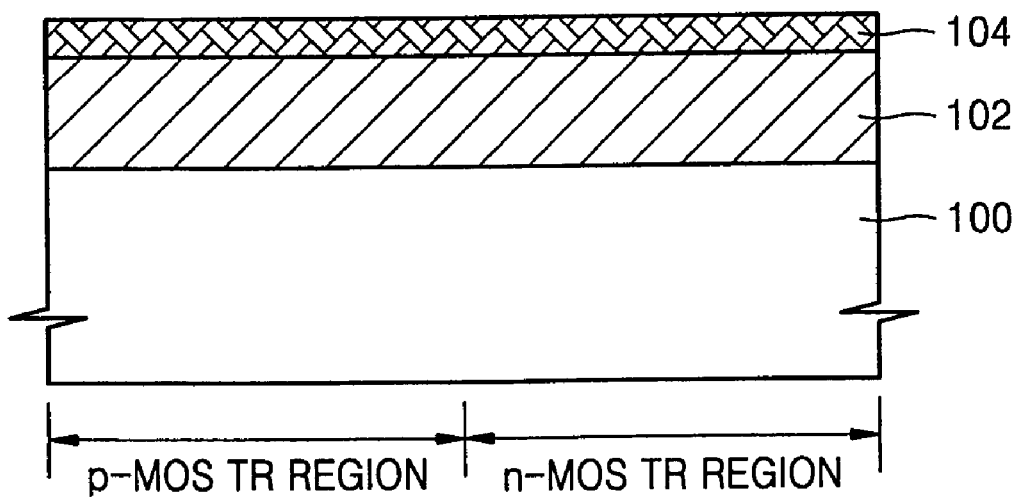
FIGS. 6 through 10 are cross-sectional views explaining a method of fabricating a CMOS transistor according to an embodiment of the present invention.

Referring to FIG. 6, a semiconductor substrate 100, e.g. a silicon substrate, is prepared. A polysilicon layer 102 used as a gate insulating layer (not shown) and a gate is formed on the semiconductor substrate 100. Next, a buffer oxide 104 is formed on the polysilicon layer 102 to prevent the polysilicon layer 102 from being consumed during fabrication due to a possible formation of a damaged region. The semiconductor substrate 100 includes a p-MOS transistor region for forming a p-MOS transistor and an n-MOS TR region for forming an n-MOS transistor.

Figure 7:
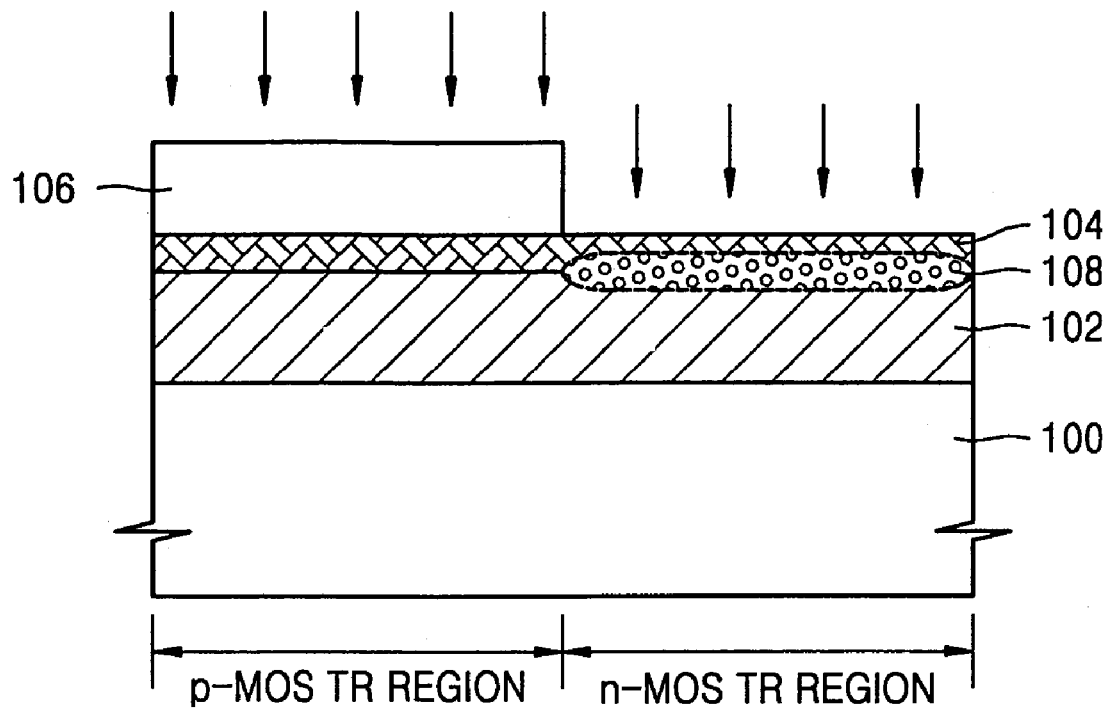

Referring to FIG. 7, a photoresist pattern 106, which is used as an ion-implantation mask for forming an n-MOS transistor gate, is formed on the buffer oxide 104. Next, a required dose of impurity, e.g. phosphorous (P), is implanted into the polysilicon layer 102 of the exposed n-MOS transistor region, using the photoresist pattern 106 as an ion-implantation mask.

If the dose of impurity implanted into the polysilicon layer 102 of the n-MOS TR region is too large, a damaged region 108 is formed in an upper portion of the polysilicon layer 102 of the n-MOS transistor region in spite of the presence of the buffer oxide 104.

Figure 8:
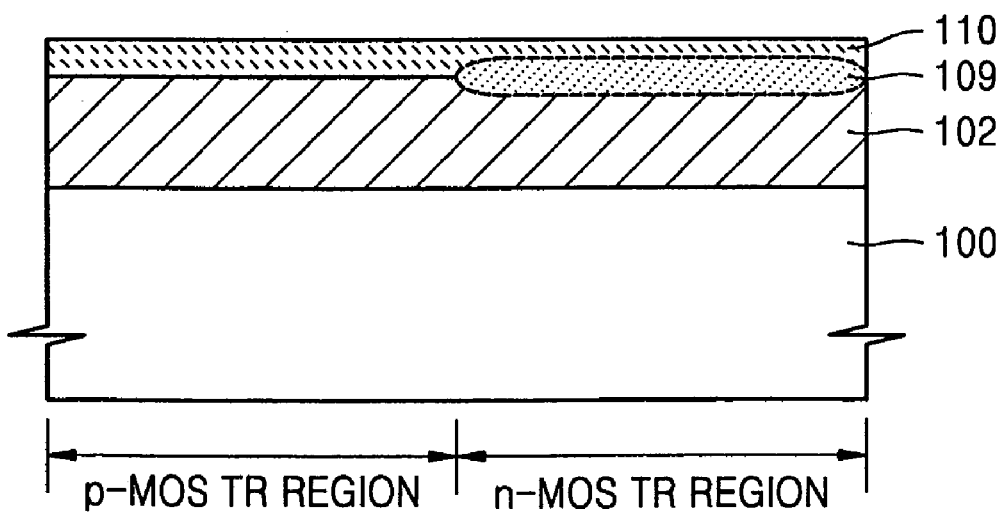

Referring to FIG. 8, the photoresist pattern 106 is removed. Next, the buffer oxide 104 is removed using an oxide etching solution. The damage 108 is changed into a curing portion 109 by annealing the polysilicon layer 102. Annealing of the polysilicon layer 102 is performed using a thermal process at a temperature of approximately 100-600° C. The thermal process may be performed using rapid thermal processing (RTP) or chemical vapor deposition (CVD).

Next, an antireflection film 110 used in gate etching is formed on the polysilicon layer 102. The antireflection film 110 is formed using silicon-oxy-nitride (SiON) or silicon nitride (SiN).

Figure 9:
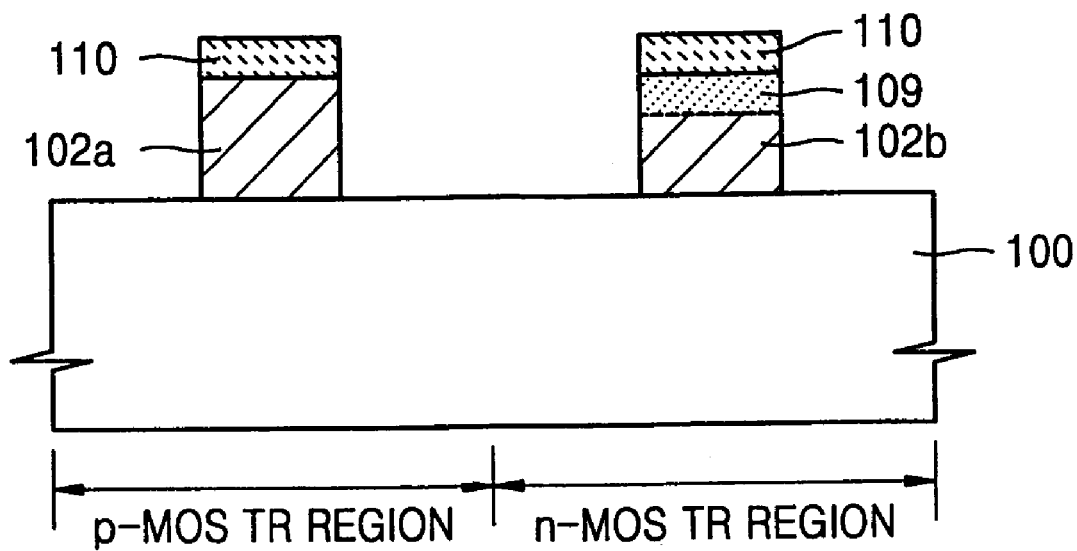

Referring to FIG. 9, after a photoresist pattern (not shown) is formed on the antireflection film 110, etching for gate formation is performed. As a result, a p-MOS transistor gate 102a and an n-MOS transistor gate 102b are formed.

Figure 10:
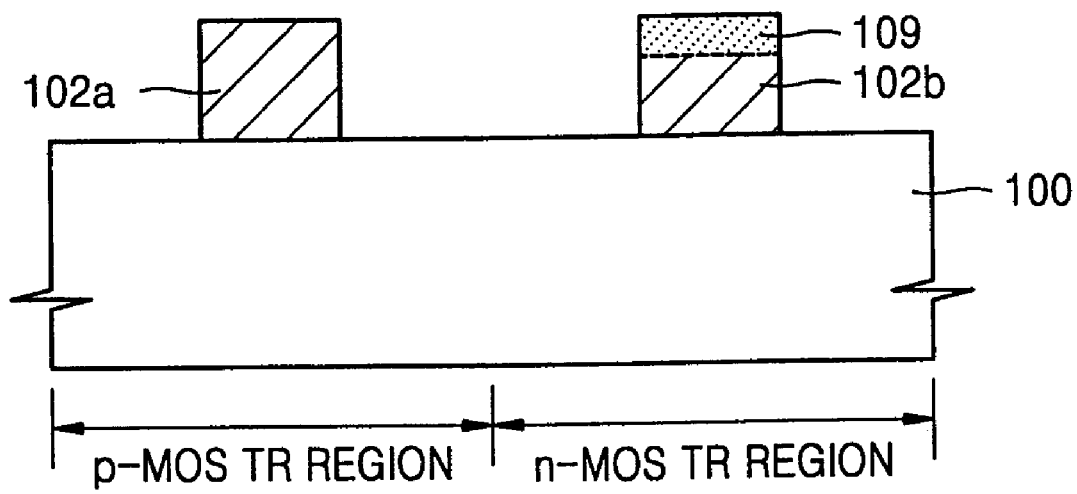

Referring to FIG. 10, the antireflection film 110 is removed by cleaning with a cleaning solution that has substantially no oxygen ($O_2$) or hydrogen peroxide ($H_2O_2$). By removing the antireflection film 110 with the cleaning solution that has substantially no oxygen ($O_2$) or hydrogen peroxide ($H_2O_2$), the curing portion 109 remains as shown in FIG. 10, and thus the height of the n-MOS transistor gate 102b is not decreased.

The cleaning solution, which does not include oxygen ($O_2$) or hydrogen peroxide ($H_2O_2$) and is used for cleaning the antireflection film 110, may be a hydrofluoric acid (HF) solution. The ratio of pure water ($H_2O$) to hydrofluoric acid (HF) is approximately 5:1-2000:1.

Also, before, after, or both before and after the structure is cleaned with the hydrofluoric acid (HF) solution, SC-1 cleaning may be further performed. SC-1 cleaning is performed with a cleaning solution including ammonium hydroxide ($NH_4OH$), hydrogen peroxide ($H_2O_2$), and pure water ($H_2O$). Although hydrogen peroxide ($H_2O_2$) is included in SC-1 cleaning, the height of the n-MOS transistor gate does not decrease substantially because the curing portion 109 is present on the n-MOS transistor gate 102b by annealing.

As described above, in the method of fabricating the CMOS transistor according to an exemplary embodiment of the present invention, a damaged region caused by an impurity implanted into a polysilicon layer of an n-MOS transistor region is changed into a curing portion by annealing and a cleaning solution that does not include oxygen ($O_2$) or hydrogen peroxide ($H_2O_2$) is used when removing an antireflection film. Therefore, gate thinning does not occur. That is, the height of the n-MOS transistor gate does not decrease.

While the present invention has been particularly shown and described with reference to an exemplary embodiment thereof, it will be understood by those of ordinary skill in the art that various changes in form and details may be made therein without departing from the spirit and scope of the invention as defined by the appended claims and their equivalents.

What is claimed is:

1. A method of fabricating a semiconductor device, the method comprising:
   forming a polysilicon layer on a semiconductor substrate;
   implanting an impurity into the polysilicon layer, thereby forming a damaged region in an upper portion of the polysilicon layer;
   thereafter, changing the damaged region to a curing portion by annealing the polysilicon layer having the damaged region using a thermal process;
   after changing the damaged region to the curing portion, forming a p-MOS transistor gate and an n-MOS transistor gate from the polysilicon layer; and
   cleaning the p-MOS transistor gate and the n-MOS transistor gate with a hydrofluoric acid (HF) solution without causing a substantial reduction in height of either transistor gate.

2. The method of claim 1, after forming the polysilicon layer, further comprising forming a buffer oxide on the polysilicon layer.

3. The method of claim 1, before forming the p-MOS transistor gate and the n-MOS transistor gate, further comprising forming an antireflection film on the polysilicon layer.

4. The method of claim 3, wherein the antireflection film comprises silicon-oxy-nitride (SiON) or silicon nitride (SiN).

5. The method of claim 3, further comprising forming the antireflection film directly on the polysilicon layer.

6. The method of claim 1, wherein the annealing is performed at a temperature of approximately 100-600° C.

7. The method of claim 1, wherein a ratio of pure water ($H_2O$) to hydrofluoric acid (HF) is approximately 5:1-2000:1 in the hydrofluoric acid (HF) solution.

8. The method of claim 1, before, after, or both before and after the HF cleaning, further comprising performing SC-1 cleaning.

9. A method of fabricating a CMOS transistor, the method comprising:
   forming a polysilicon layer on a semiconductor substrate having an n-MOS transistor region;
   forming a buffer oxide on the polysilicon layer;
   implanting an impurity into the polysilicon layer, thereby forming a damaged region in an upper portion of the polysilicon layer in the n-MOS transistor region;
   removing the buffer oxide;
   thereafter, changing the damaged region to a curing portion by annealing the polysilicon layer having the damaged region in the n-MOS transistor region using a thermal process;
   forming an antireflection film on the polysilicon layer;
   after changing the damaged region to the curing portion, forming a p-MOS transistor gate and an n-MOS transistor gate from the polysilicon layer; and
   cleaning the p-MOS transistor gate and the n-MOS transistor gate with a hydrofluoric acid (HF) solution, thereby removing the antireflection film without causing a substantial reduction in height of either transistor gate.

10. The method of claim 9, wherein the antireflection film comprises silicon-oxy-nitride (SiON) or silicon nitride (SiN).

11. The method of claim 9, wherein the annealing is performed at a temperature of approximately 100-600° C.

12. The method of claim 9, wherein a ratio of pure water ($H_2O$) to hydrofluoric acid (HF) is about 5:1-2000:1 in the hydrofluoric acid (HF) solution.

13. The method of claim 9, before, after, or both before and after the HF cleaning, further comprising performing SC-1 cleaning.

14. The method of claim 9, further comprising forming the antireflection film directly on the polysilicon layer.

15. A method of fabricating a CMOS transistor, the method comprising:
   forming a polysilicon layer on a semiconductor substrate;
   implanting an impurity into the polysilicon layer, thereby forming a damaged region in an upper portion of the poly silicon layer;
   thereafter, changing the damaged region to a curing portion by annealing the polysilicon layer having the damaged region using a thermal process;
   after changing the damaged region to the curing portion, forming a p-MOS transistor gate and an n-MOS transistor gate from the polysilicon layer; and
   cleaning the p-MOS transistor gate and the n-MOS transistor gate with a cleaning solution that has substantially no oxygen ($O_2$) or hydrogen peroxide ($H_2O_2$), not to cause a substantial decrease in height of either transistor gate.

16. The method of claim 15, wherein the cleaning solution is a hydrofluoric acid (HF) solution.

17. The method of claim 16, wherein a ratio of pure water ($H_2O$) to hydrofluoric acid (HF) is about 5:1-2000:1 in the hydrofluoric acid (HF) solution.

18. The method of claim 16, before, after, or both before and after the HF cleaning, further comprising performing SC-1 cleaning.

19. The method of claim 15, after forming the polysilicon layer, further comprising forming a buffer oxide on the polysilicon layer.

20. The method of claim 15, before the forming of the p-MOS transistor gate and the n-MOS transistor gate, further comprising forming an antireflection film on the polysilicon layer.

21. The method of claim 20, wherein the antireflection film comprises silicon-oxy-nitride (SiON) or silicon nitride (SiN).

22. The method of claim 20, further comprising forming the antireflection film directly on the polysilicon layer.

23. The method of claim 15, wherein the annealing is performed at a temperature of approximately 100-600° C.

* * * * *

UNITED STATES PATENT AND TRADEMARK OFFICE
CERTIFICATE OF CORRECTION

PATENT NO. : 7,268,029 B2  
APPLICATION NO. : 10/994042  
DATED : September 11, 2007  
INVENTOR(S) : Eun-kuk Chung et al.

It is certified that error appears in the above-identified patent and that said Letters Patent is hereby corrected as shown below:

Column 6, line 12, the words "poly silicon" should read -- polysilicon --.

Signed and Sealed this

Sixteenth Day of September, 2008

JON W. DUDAS  
*Director of the United States Patent and Trademark Office*